United States Patent [19]

Lawandy

[11] Patent Number: 5,481,630

[45] Date of Patent: Jan. 2, 1996

[54] OPTICALLY ENCODED PHASE MATCHED SECOND HARMONIC GENERATION, SELF FREQUENCY DOUBLING LASER MATERIAL, AND OPTICAL SWITCH USING SEMICONDUCTOR MICROCRYSTALLITE DOPED GLASSES

[75] Inventor: Nabil M. Lawandy, Providence, R.I.

[73] Assignee: Intellectual Property Development Associates of Connecticut, Inc., Trumbull, Conn.

[21] Appl. No.: 350,407

[22] Filed: Dec. 6, 1994

Related U.S. Application Data

[62] Division of Ser. No. 90,818, Jul. 13, 1993, Pat. No. 5,383,038, which is a division of Ser. No. 778,593, Oct. 17, 1991, Pat. No. 5,253,258.

[51] Int. Cl.$^6$ ................... G02B 6/26; G02F 1/35
[52] U.S. Cl. ................... 385/16; 385/14; 385/15; 385/132; 385/39; 385/42; 385/50; 385/122; 359/326; 359/332
[58] Field of Search ................... 359/1, 3, 4, 7, 359/10, 11, 15, 22, 27, 30, 34, 326, 328, 329, 330, 332; 372/7, 21, 22, 23; 385/14, 129, 130, 131, 132, 122, 141, 15, 16, 39, 41, 42, 50; 65/17, 18.1, 18.3, 3.1, 3.11; 501/40, 41, 32, 47

[56] References Cited

U.S. PATENT DOCUMENTS

| | | | |
|---|---|---|---|
| 3,782,802 | 1/1974 | Micheron et al. | 359/7 X |
| 3,891,975 | 6/1975 | Deml et al. | 359/3 X |
| 4,012,108 | 3/1977 | Ishii et al. | 359/3 X |
| 4,063,795 | 12/1977 | Huignard et al. | 359/1 X |
| 4,107,144 | 4/1977 | Staebler | 359/3 X |
| 4,272,550 | 12/1993 | Dickson et al. | 359/3 |
| 4,335,934 | 6/1982 | Black et al. | 385/127 X |
| 4,339,173 | 7/1982 | Aggarwal et al. | 385/142 X |
| 4,385,802 | 5/1983 | Blasyzk et al. | 385/127 X |
| 4,428,646 | 1/1984 | Lighty | 385/124 X |
| 4,431,263 | 2/1984 | Garito | 385/143 X |
| 4,478,623 | 10/1984 | Olshansky | 65/3.12 |
| 4,536,450 | 8/1985 | Garito | 428/411.1 |

(List continued on next page.)

OTHER PUBLICATIONS

Journal of the Optical Society of America vol. 9, No. 6, Jun. 1991 pp. 1307–1314 N. M. Lawandy et al. "Optically Encoded Phase–Matched Second Harmonic Generation In . . .".

Applied Physics Letters vol. 53, No. 13, Sep. 1988, pp. 1144–1146 N. Finlayson et al., "Picosecond Switching Induced by Saturable Absorption . . .".

Conference on Quantum Electronics Laser Science 1991 May 1991, Baltimore, Md. p. 48, R. L. MacDonald et al. "Second Harmonic Generation in Semiconductor–Doped Glass Waveguides".

Conference on Quantum Electronics Laser Science 1991 May 1991, Baltimore, Md. p. 50, R. L. MacDonald et al. "Optically Encoded Second Harmonic Generation in Semiconductor . . .".

(List continued on next page.)

*Primary Examiner*—Brian Healy

[57] ABSTRACT

There is described a semiconductor microcrystallite doped glass that exhibits SHG, and a method of preparing, or encoding, a semiconductor microcrystallite doped glass by the simultaneous injection of fundamental and second harmonic fields, such as 1.06 µm and 532 nm. More specifically, the disclosure pertains to a structure that exhibits SHG, the structure being comprised of, by example, borosilicate glass that contains $CdS_xSe_{1-x}$ microcrystallites. Also disclosed are embodiments of devices having an optical waveguide structure formed within a glass substrate that contains semiconductor microcrystallites. The optical waveguide structure guides and contains injected radiation and also converts a portion thereof to the second harmonic. Also disclosed are optoelectronic devices that include frequency doublers, self-doubling lasant material, bichromatic optical switches, and a volume holographic medium, all of which include a glass host having semiconductor microcrystallites embedded within.

7 Claims, 10 Drawing Sheets

U.S. PATENT DOCUMENTS

| | | | |
|---|---|---|---|
| 4,756,598 | 7/1988 | Gerbi et al. | 385/122 X |
| 4,763,019 | 8/1988 | Duguay et al. | 359/328 |
| 4,770,494 | 9/1988 | Csencsits et al. | 385/142 X |
| 4,775,215 | 10/1988 | Teng et al. | 385/143 X |
| 4,804,247 | 2/1989 | Kyoto et al. | 385/142 X |
| 4,822,399 | 4/1989 | Kanamori et al. | 65/3.12 |
| 4,826,283 | 5/1989 | Chuangtian et al. | 385/122 X |
| 4,861,129 | 8/1989 | Che et al. | 385/122 X |
| 4,865,406 | 9/1989 | Khanarian et al. | 385/122 X |
| 4,867,510 | 9/1989 | Dobson | 372/33 X |
| 4,892,375 | 1/1990 | Chikuma et al. | 385/33 X |
| 4,896,933 | 1/1990 | Yano et al. | 350/96.15 |
| 4,913,990 | 4/1990 | Rallison | 359/3 X |
| 4,927,220 | 5/1990 | Hesselink et al. | 359/7 X |
| 4,946,253 | 8/1990 | Kostuck | 359/15 X |
| 5,013,129 | 5/1991 | Harada et al. | 383/122 X |
| 5,059,001 | 10/1991 | Shimizu | 359/24 |
| 5,113,473 | 5/1992 | Yoshida et al. | 385/131 |
| 5,117,472 | 5/1992 | Blyler, Jr. | 385/28 |
| 5,134,095 | 7/1992 | Omi et al. | 501/47 |
| 5,157,674 | 10/1992 | Lawandy | 372/22 |
| 5,162,939 | 11/1992 | Herron et al. | 359/326 |
| 5,167,000 | 11/1992 | Minemoto et al. | 385/122 |
| 5,185,823 | 10/1992 | Enomoto et al. | 428/216 |
| 5,189,722 | 2/1993 | Chikuma | 385/122 |
| 5,253,086 | 10/1993 | Lungershausen et al. | 359/10 |
| 5,253,258 | 10/1993 | Lawandy | 372/22 |
| 5,383,038 | 1/1995 | Lawandy | 359/7 |
| 5,401,569 | 3/1995 | Kineri et al. | 359/329 X |

OTHER PUBLICATIONS

Conference on Quantum Electronics Laser Science 1991 May 1991, Baltimore, Md. pp. 48–49, V. M. Churikov et al. "X(2) Grating in Bulk Glass" Abstract JTU84.

Optics Letters, vol. 15, No. 21, Nov. 1991, N.Y., pp. 1236–1238 Y. Kapitzky et al. "Second–Order Polarizability Holograms . . . ".

"Frequency Doubling of 1.319 μm Radiation in an Optical Fibre by Optically Written $X^{(2)}$ Grating", M. C. Farries et al. Elect. Lett. Jan. 1988.

"Tunable Second Order Susceptibility Gratings for Harmonic Generation in Optical Fibres", M. C. Farries et al., Optical Fibre Group, University of Southampton, Jun. 1988.

"Efficient Second Harmonic Generation in an Optical Fibre" IEEE Col. on Nonlineear Optical Waveguides, London, Jun. 1988.

"Dye Laser Pumped by Nd:YAG Laser Pulses Frequency Doubled in an Glass Optical Fiber", U. Osterberg et al., 1986 Optical Society of America.

OPTICALLY ENCODED PHASE MATCHED SECOND HARMONIC GENERATION, SELF FREQUENCY DOUBLING LASER MATERIAL, AND OPTICAL SWITCH USING SEMICONDUCTOR MICROCRYSTALLITE DOPED GLASSES

This is a division of application Ser. No. 08/090,818, filed on Jul. 13, 1993, now U.S. Pat. No. 5,383,038, which is a division of U.S. Ser. No. 07/778,593, filed on Oct. 17, 1991, now U.S. Pat. No. 5,253,258, issued Oct. 12, 1993.

CROSS REFERENCE TO RELATED PATENT APPLICATION

This patent application is related to U.S. patent application Ser. No. 07/722,345, filed Jun. 27, 1991, entitled "Second Harmonic Generation and Self Frequency Doubling Laster Materials Comprised of Bulk Germanosilicate and Aluminosilicate Glasses", by Nabil M. Lawandy, now U.S. Pat. No. 5,157,674.

FIELD OF THE INVENTION

This invention relates generally to non-linear optical devices and, in particular, to non-linear optical devices constructed from a glass material.

BACKGROUND OF THE INVENTION

Recently there has been considerable interest in glasses doped with $CdS_xSe_{1-x}$ semiconductor microcrystallites. This has been due to interest in the fundamental physics of low dimensional systems, as well as the technologically important areas associated with optical switching as referred to in K. M. Leung, Phys. Rev. A 33, 2461 (1986) and A. I. Ekimov et al. Solid State Comm. 69, 565 (1989). In the case of commercially available colloidally colored filter glasses the crystallite size is of the order of 5–10 nm, making the crystallite larger than the bulk exciton radius, and thus out of the quantum dot regime. These materials have been the subject of several investigations using four wave mixing, interferometric methods and luminescence detection, as mentioned in R. K. Jain et al., J. Opt. Soc. Am. 73, 646 (1983) and M. Tomita et al., J. Opt. Soc. Am B 6, 165 (1989). From these measurements $\chi^{(3)}(\omega, \omega-,\omega)$ values have been measured which range from $10^{-11}$ to $10^{-7}$ esu. In addition, a large spread in response times, ranging from 72 μsec to 10 psec, has been observed along with an intensity dependence. Other effects which are indirectly associated with these observations are thermally reversible photodarkening, non-quadratic dependence of phase conjugate reflectivity on pump intensity, Franz-Keldysh oscillations, and luminescence.

It is an object of this invention to provide second harmonic generation (SHG) in glasses doped with semiconductor microcrystallites.

It is another object of the invention to provide a method of preparing a semiconductor doped glass material so as to exhibit SHG.

It is a further object of the invention to provide SHG in a silica-based glass that contains, by example, $CdS_xSe_{1-x}$ or CuCl microcrystallites.

It is one further object of the invention to provide optical waveguide structures, optical switching devices, and holographic memory devices that are fabricated with a silica-based glass that contains semiconductor microcrystallites.

It is another object of the invention to provide a lasant material that simultaneously lases and frequency doubles the laser radiation.

It is one further object of the invention to provide a semiconductor laser diode that includes a frequency doubler comprised of a semiconductor microcrystallite doped glass.

SUMMARY OF THE INVENTION

The foregoing objects are realized by a semiconductor microcrystallite doped glass that exhibits SHG, and by a method of preparing, or encoding, a microcrystallite doped glass by the simultaneous injection of fundamental and second harmonic fields, such as 1.06 μm and 532 nm. More specifically, the invention provides a structure that exhibits SHG, the structure being comprised of a silica-based glass that is doped with, by example and not by limitation, $CdS_xSe_{1-x}$, CuCl, PbS, GaAs, InP, ZnSe, or ZnSeS microcrystallites.

Although these composite materials have a center of inversion on a macroscopoic scale, and are therefore expected to possess no second order susceptibility, the inventor has determined that this symmetry can be broken, and that phase matching can be encoded, when the material is simultaneously exposed to optical radiation having a first wavelength and a second wavelength, the second wavelength being one half of the first wavelength. By example, the first wavelength is 1.06 μm and the second wavelength is 532 nm. The radiation may be generated by a modelocked and Q-switched laser. The SHG effect is permanent in some glass/microcrystallite systems and is a strong function of the position of the microcrystallite energy bandgap.

The use of the invention also provides a permanent, quasi-phase matched, second harmonic signal which is approximately $10^5$ times an initial background value. The inventor has obtained second harmonic signals which are visible in room lights, corresponding to a conversion efficiency of $10^{-6}$ for modelocked, Q-switched input pulses. Experimentally obtained results are presented which explain the underlying physical mechanisms. These include polarization dependence, OIR and second harmonic preparation intensity effects, thermal erasure, and the application of external static electric fields. These results are shown to indicate that a most likely mechanism is an encoding of a periodic internal electric field that results in a phase matched Electric Field Induced Second Harmonic generation (EFISH) process.

The invention also provides an optical waveguide structure and a method of fabricating same. The waveguide structure provides SHG for optical radiation propagating therethrough. The waveguide structure is fabricated through an ion exchange process in conjunction with a photolithographic masking process. Both planar and channel waveguides are described.

The invention also provides a laster medium, such as a glass laser rod, or optical fiber that simultaneously lases and frequency doubles the laser radiation.

Further embodiments of the invention provide optical switching devices and a holographic medium that frequency double an input beam wavelength.

BRIEF DESCRIPTION OF THE DRAWING

The above set forth and other features of the invention are made more apparent in the ensuing Detailed Description of the Invention, when read in conjunction with the attached Drawing, wherein:

FIG. 13b is a cross sectional view showing the waveguide of FIG. 13a;

DETAILED DESCRIPTION OF THE INVENTION

Figure 1A:
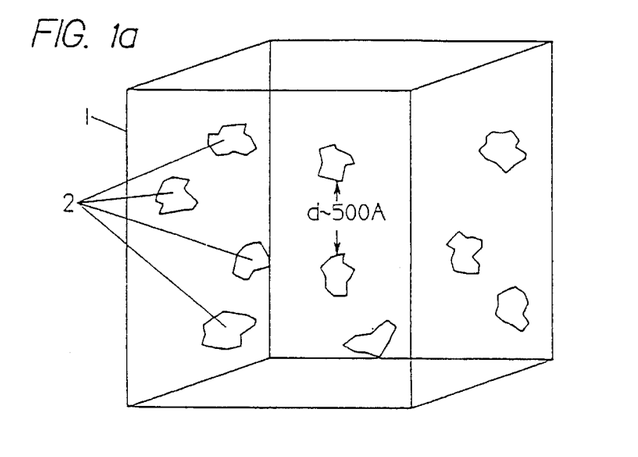
FIG. 1a depicts an enlarged view of a glass host material having semiconductor microcrystallites contained within.

FIG. 1a illustrates a volume of silica-based glass host material 1 having a plurality of microcrystallites 2 embedded therein. The microcrystallites are comprised of a semiconductor material. The invention is described below primarily in the context of a borosilicate glass host material having $CdS_xSe_{(1-x)}$ microcrystallites contained therein. These microcrystallites are uniformly distributed throughout the glass host material and have a nominal spacing between them that is a function of the concentration of the microcrystallites. It should be realized, however, that the teaching of the invention is not to be construed to be limited to only this material combination or to uniform distributors of microcrystallites. For example, a glass host may include semiconductor PbS, CuCl, GaAs, InP, ZnSe, or ZnSeS microcrystallites. Furthermore, the concentration of the microcrystallites may be other than uniform for providing SHG at only selected portions of the glass host material.

As employed herein, a semiconductor microcrystallite or crystallite is considered to be a single crystal or a polycrystalline aggregate of a semiconductor material having an energy band structure. Aggregates which exhibit bulk, as well as quantum dot behavior, are included within this definition.

The $CdS_xSe_{(1-x)}$ microcrystallites 2 may be present in a concentration of approximately 0.3 mole percent to concentrations up to 50 mole percent or greater. The greater the mole percent concentration the greater is the SHG effect. The microcrystallites 2 are randomly oriented and have dimensions on the order of approximately 100 angstroms to approximately 200 angstroms. Although $CdS_xSe_{(1-x)}$ is non-centrosymmetric, the random orientations of the crystallites 2 result in $\chi^{(2)}=0$ for the composite system. This result is exploited by the invention to provide SHG in the manner described in detail below.

The glass host 1 may also contain Na or K in a concentration range of approximately 5 mole percent to 20 mole percent. Nd may also be present in a concentration of, for example, 1.5 percent. The invention also provides for the construction of glass laser rods or optical fibers that provide a fundamental frequency and twice the fundamental frequency. This aspect of the invention is described in detail below.

Each microcrystallite 2 retains, within the glass host 1, the basic properties of the bulk semiconductor. Also, the non-linear susceptibility of the microcrystallites, $\chi^{(3)}$mc, is greatly enhanced for above bandgap excitation. For example, quoted values of $\chi^{(3)}(\omega_2-2\omega_1;\omega_1,-\omega_2)$ for CdS at $\lambda=0.694$ μm and $\lambda=0.53$ μm are $2.24\times10^{-20}$ m²/V² and $1.05\times10^{-17}$ m²/V², respectively. The second wavelength, which is at the band edge of CdS, results in a $\chi^{(3)}$mc which is $10^3$ times the off-resonance value, and approximately $10^5$ times larger than that of silica. Thus, if electron dynamics within the microcrystallites 2 are considered, internal optical rectification fields as large as $10^7$ V/m are expected, which includes the static dielectric constant of CdS, εr~8.9 for above-gap excitation. Such large fields result in energy increases as large as several tenths of an electron-volt across the microcrystallite.

For the purpose of characterizing the SHG effect with microcrystallite doped glass materials, experiments were performed on optical filters of a type manufactured by Schott Glass; the filters ranging from GG 495 to RG 630 and having a variety of thicknesses (1 mm to 5 cm). These filters are comprised of a glass host doped with $CdS_xSe_{(1-x)}$ microcrystallites. The filter nomenclature is such that the number, such as 495, gives the approximate semiconductor bandgap in nanometers.

Figure 12:
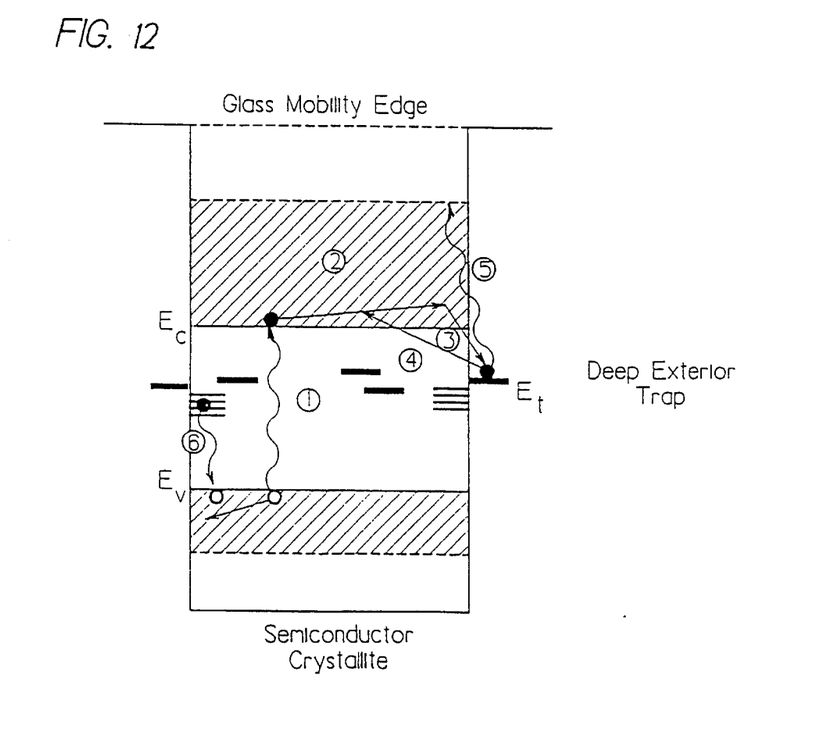
FIG. 12 depicts an energy band diagram that illustrates a mechanism for SHG preparation in a semiconductor microcrystallite doped glass.

One possible mechanism for the SHG encoding process is shown in FIG. 12. The diagram represents a basic energy level structure for a direct gap semiconductor and its relation to the surrounding glass. The primary optical encoding steps are believed to be: 1) optical excitation of the electron to the conduction band ($E_c$); 2) motion of the electron under the influence of the internal optical rectification field, establishing a wavefunction pinned against one side of the crystallite; and 3) trapping in an "exterior" deep trap of energy Et.

Measurements on photo-ionization of CdS microcrystallites in glasses have demonstrated such trapping when above bandgap excitation was employed, and indicate that the trap site is most likely a deep electron trap in the glass matrix near the crystallite surface. The optical encoding, described below, is believed to add directionality to this basic process.

In FIG. 12 the arrow designated 4 shows a thermal SHG erasure via ionization to the conduction band, and arrow 5 indicates an optical SHG erasure mechanism via direct absorption. The arrow 6 indicates luminescence from interior surface trapping sites. The thermal and optical SHG erasure mechanisms are described in further detail below.

Figure 1B:
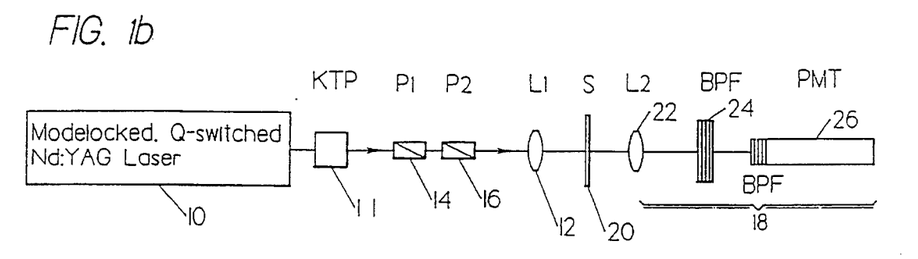
FIG. 1b shows optical apparatus for preparing a semiconductor microcrystallite doped glass for SHG.

Optical apparatus for preparing semiconductor microcrystallite doped glasses (SMDG) for SHG is shown in FIG. 1b, wherein P1 and P2 are polarizers; L1 and L2 are 10 cm lenses; S is a microcrystallite doped glass sample; BFP is a 532 nm bandpass interference filter; and PMT is a photomultiplier tube.

More specifically, the apparatus includes a modelocked, Q-switched and frequency doubled Nd:YAG laser 10, a KTP crystal 11, a 10 cm focussing lens 12, cross-polarizers 14 and 16, and a phase sensitive detection system 10 capable of detecting $10^{-14}$ W of average power. The laser 10 produces pulses that are 120 psec and 90 psec in duration at 1.06 μm and 532 nm, respectively, with a 76 MHz modelocking rate and a Q-switched rate of 1 kHz. The pulses incident on a SMDG sample 20 are linearly polarized and are focussed to a measured spot size 30 μm in diameter (for 1.06 μm radiation). The laser/cross-polarizer system delivers up to 3 Watts of average power at 1.06 μm, and up to 1 watt at 532 nm. The two beams are not separated in order to minimize any relative phase jitter effects due to dispersive thermal index effects in beam separation and recombination optics.

The second harmonic signals are detected using a lens 22 and up to four band pass filters (BPFs) 24. A photomultiplier tube (PMT) 26 gain is held constant throughout all experiments. The signals from prepared samples were measured using calibrated neutral density filters. In accordance with the invention typical values of background SHG corresponded to a conversion efficiency of approximately $10^{-13}$ to $10^{-12}$, with 1 W of incident average power at 1.06 μm.

It is noted that the apparatus described above provides preparation for $CdS_xSe_{1-x}$ and employs 1.06 μm and 532 nm radiation. However, for other semiconductor microcrystallites other wavelengths are appropriate. For example, for CuCl wavelengths of approximately 0.7 nm and approximately 0.35 nm are employed. In general, the fundamental wavelength is within a range of approximately two micrometers to approximately 0.5 micrometers, and the second harmonic wavelength is one half of the fundamental.

Figure 2:
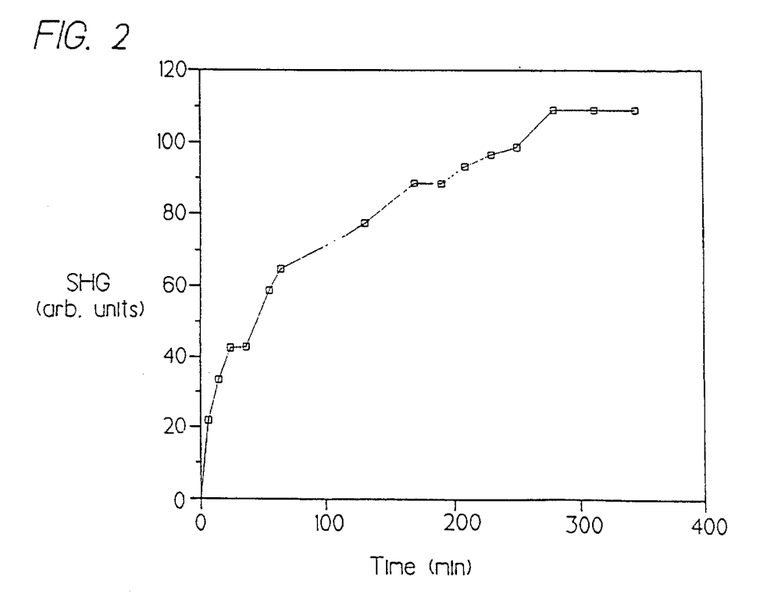
FIG. 2 shows a time dependence for SHG preparation in a 1 mm thick OG 550 filter illuminated with 2 W and 50 mW of 1.06 μm and 532 nm radiation, respectively.

Initial experiments were performed on one mm thick OG 550 filter glass in order to determine a time evolution of the SHG process. The preparation process was interrupted periodically to read out the second harmonic power. FIG. 2 shows the time evolution for the OG 550 filter exposed to 2 W and 50 mW of average power at 1.06 μm and 532 nm, respectively. The results show that the SHG increases by $10^5$ and that saturation occurs on the time scale of a few hours. Similar experiments were performed on a non-resonant bandgap filter (GG 495) and resulted in the same basic time evolution.

Figure 3A:
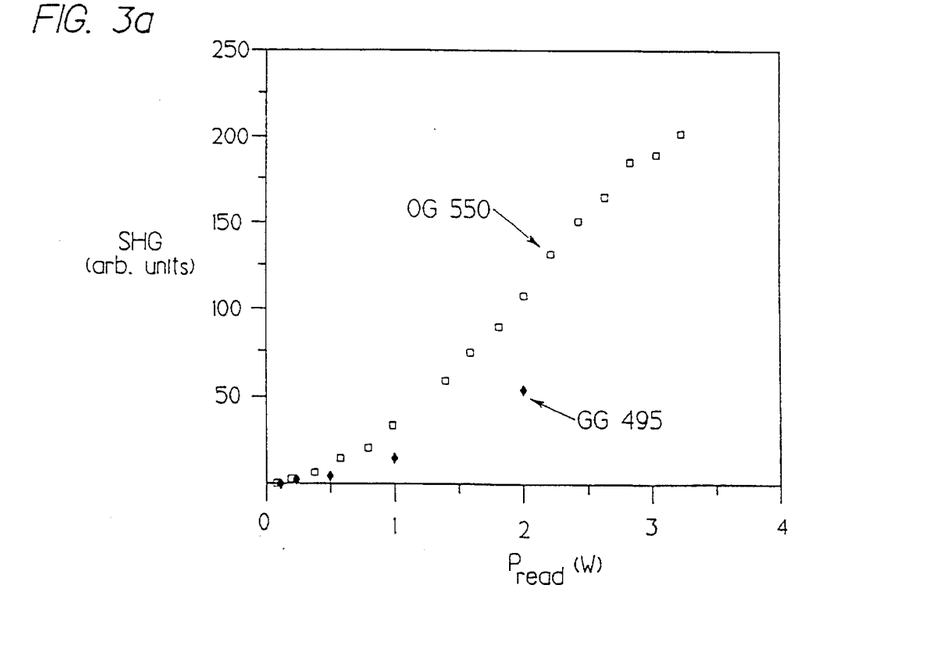
FIG. 3a illustrates a dependence of SHG on input radiation intensity for 1 mm thick samples.
Figure 3B:
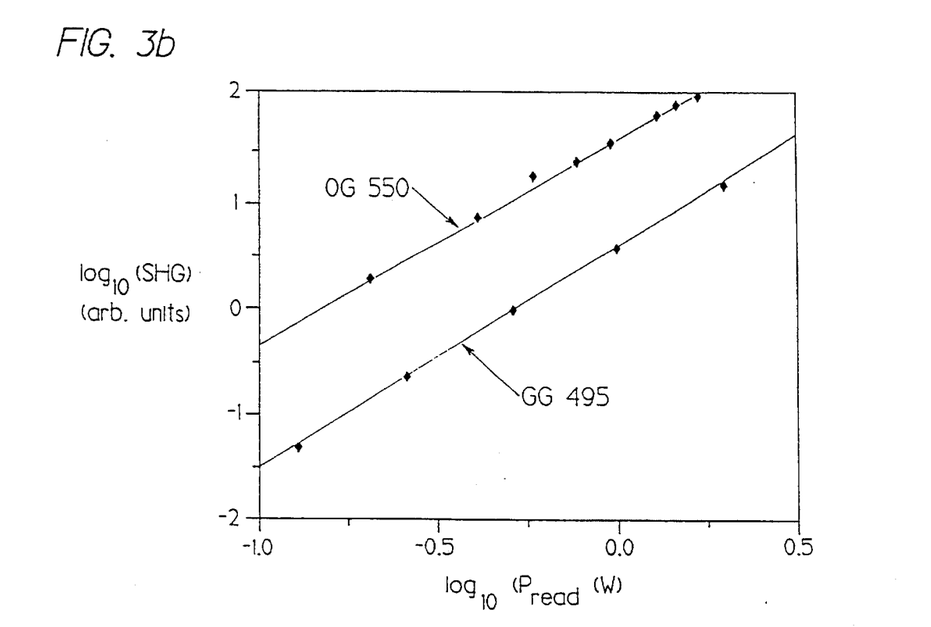
FIG. 3b illustrates a log-log plot showing a quadratic relationship of SHG to input intensity.

In order to further verify that a second order process was indeed responsible for the signals, a dependence of the SHG signal on input power was determined. The results are shown in FIG. 3a for the OG 550 and a GG 495 filter. The GG 495 filter was found to have negligible absorption at 532 nm ($\alpha$=0.03 cm$^{-1}$). This material is expected to be less sensitive to pumping and readout induced index changes from carrier excitation and thermally effected shrinkage of the energy gap, as noted in J. I. Pankove, Optical Processes in Semiconductors, Dover Publications, Inc., New York (1971), p. 27. The dependence of SHG on IR power for the GG 495 filter was determined from a least squares fit to a log-log plot of the data in FIG. 3a. FIG. 3b shows the transformed data and indicates that the process is dependent on $I(\omega)^{1.98}$ with a correlation greater than 0.99.

Based on these results it is clear that an effective second order susceptibility ($\chi^{(2)}$) is induced in these materials. The deviations from second order behavior in the OG 550 filter are believed to be due to direct and indirect intensity dependent phase matching effects. In addition to the semiconductor doped glasses, a single crystal sample of CdS was also examined. This sample exhibited a preparation induced increase in SHG of a factor of two. The result serves to demonstrate that the observed increase of several orders of magnitude observed in the SMDG is unique to the microcrystallite guest-glass host system.

Figure 4:
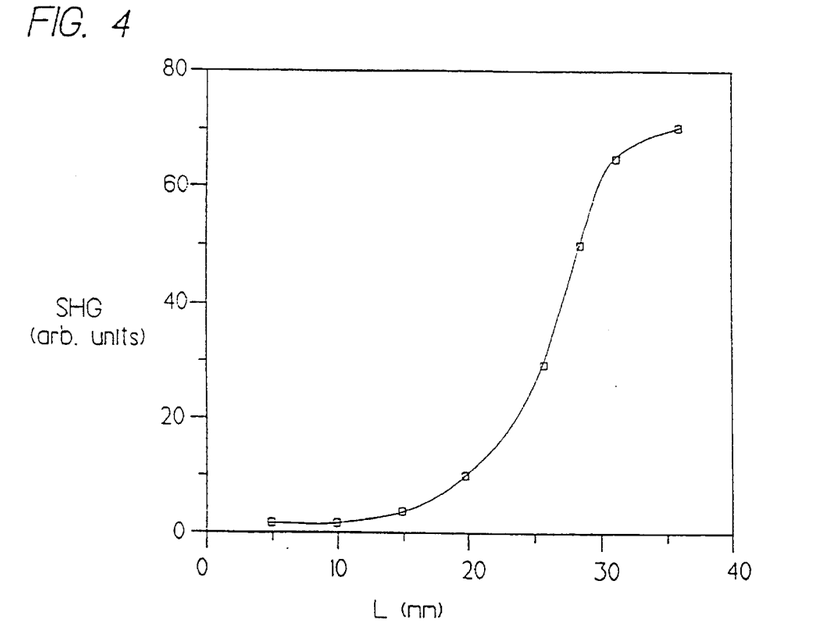
FIG. 4 shows a relationship between SHG and a length of prepared sample.

In order to further verify that a phase matched process occurs in the SMDG the scattered sidelight at 532 nm from the GG 495 filter, prepared along five centimeters, was examined using the optical system shown in FIG. 1b. FIG. 4 shows the growth of the second harmonic beam along the propagation axis of the SMDG. The filter was GG 495 prepared for four hours with 1 W and 1.5 mW of 1.06 μm and 532 nm radiation respectively. Maximum conversion efficiency corresponds to $5\times10^{-7}$. Although the dependence on length is not perfectly quadratic, the result serves to illustrate that phase matching occurs. The second harmonic conversion efficiency of this SMDG material, after nine hours of preparation, was found to be $5\times10^{-7}$. This value, along with the input beam parameters, results in a $\chi^{(2)}$ of the order of $10^{-16}$ m/V.

Figure 5:
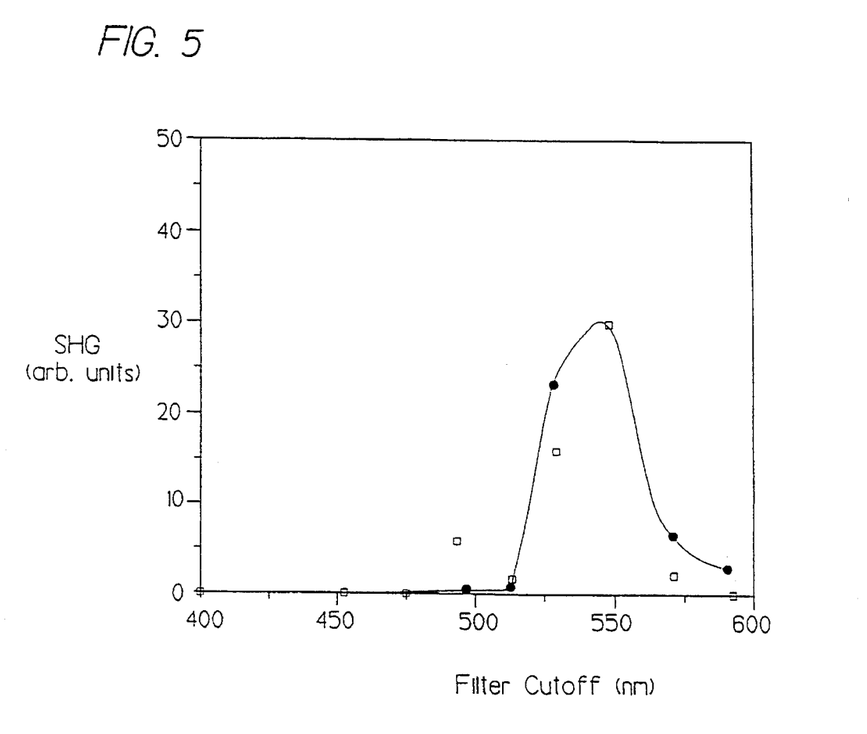
FIG. 5 displays relative conversion efficiencies of different colloidally doped filters.

In addition to the two SMDG materials discussed thus far other SMDG materials were evaluated to determine the role of resonance. For GG 495 through OG 590 filters the experiments were performed on one mm thick filters with identical preparation and readout processes. The results in FIG. 5 show the SHG efficiency of nine filters, where the OG 550 filter provides an increase of approximately four orders of magnitude. In FIG. 5 the squares are measured values, and the solid line is a best fit based on the model presented below. The GG 400 (plotted as a point at 400 nm), GG 450 and GG 475 filters were two mm thick, and all other filters were one mm thick. It appears that resonance strongly enhances the SHG effect, as will be described.

In a further experiment that dependence of the output second harmonic transverse beam structure on the writing second harmonic transverse beam profile was examined. By adjusting the KTP crystal 11 at a steep angle, the second harmonic generated by the 1.06 μm Gaussian beam emerged as a double lobe pattern, due to the KTP crystal 11 birefringence. When this beam was used in conjunction with the uniform 1.06 μm Guassian fundamental beam to prepare the GG 495 filter, it was found that the second harmonic signal generated during readout was double lobed. When the second harmonic was adjusted to have a uniform profile, the readout second harmonic emerged in a solid mode as well. This behavior of slaving the output SHG to the encoding beam pattern is identical to the effect observed in germanosilicate optical fibers, except that in the SMDG material there are no modal constraints as there are with optical fibers.

Figure 6:
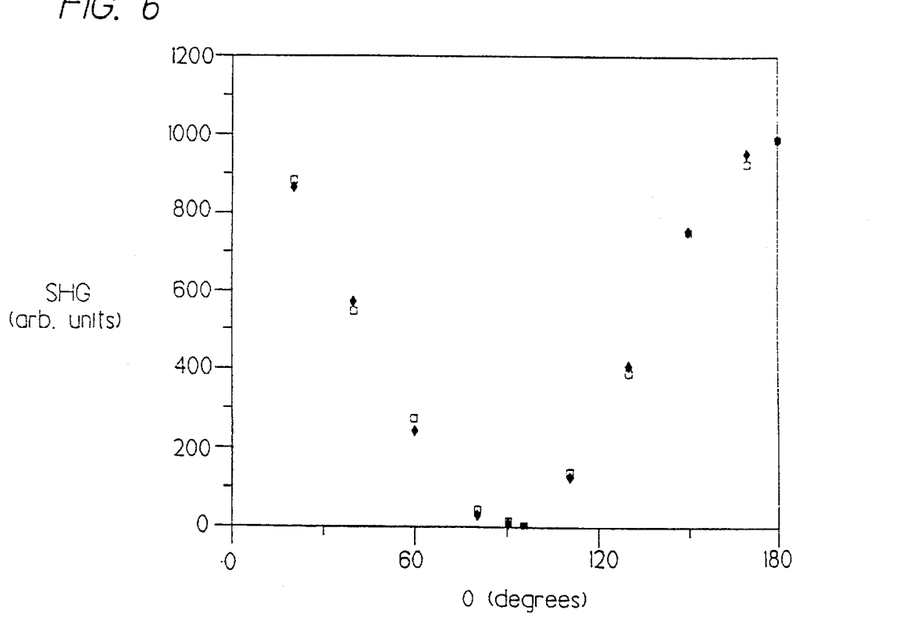
FIG. 6 illustrates SHG as a function of input polarization relative to writing polarization for an OG 550 filter.

The dependence of the SHG output on input polarization, relative to encoding polarization, is shown in FIG. 6 for the three mm OG 550 filter. Squares are measured values, and solid diamonds are proportional to $\cos^2(\theta)$. Points are scaled to account for optical erasure while reading and are corrected to account for a temporal decay of the SHG inherent in the readout process. The output power at 532 nm includes both output polarizations. SHG is seen to behave at $\cos^2(\theta)$, where $\theta$ is the angle between writing and reading polarizations. An expected $\cos^4(\theta)$ dependence may be masked by the summing over three tensor elements, all of which contribute to SHG for the linearly polarized input radiation.

It is noted that no self-preparation (i.e. preparation with no second harmonic seed radiation) was obtained over the course of a twelve hour period, even at intensities just below the damage threshold of the SMDG material (~500 W/$\mu$m$^2$).

In order to better understand the process of induced SHG in the SMDG material the intensity dependence of the preparation process was examined. Experiments were performed with GG 495 and OG 550 filters as a function both of 1.06 $\mu$m and 532 nm incident powers. The experiments were performed on one mm thick samples. Portions of the SMDG material which had never been exposed were prepared for a measurement and each exposure was limited to 20 minutes maximum. In order to minimize phase matching changes between preparation and readout, the readout IR power at each point was set to the writing value.

Figure 7:
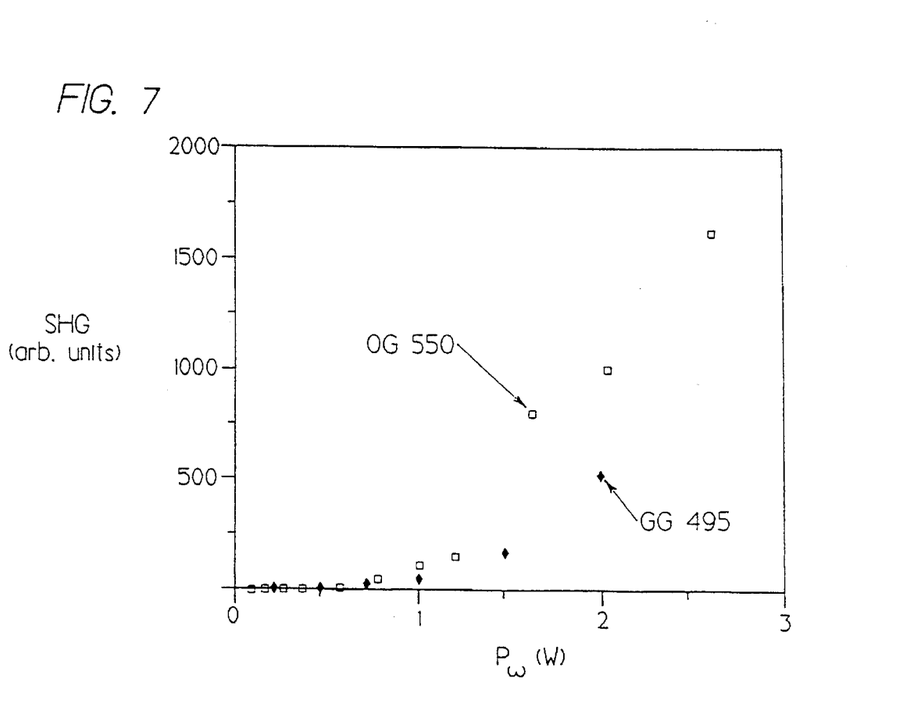
FIG. 7 depicts SHG dependence on 1.06 μm radiation preparation intensity.

FIG. 7 shows the results of the twenty minute preparation as a function of the average IR power, with the second harmonic seed power held constant at 10 mW. The OG 550 filter was three mm thick, and points were prepared for 20 minutes with 20 mW of 532 nm light in addition to the indicated IR power. The GG 495 filter was one mm thick, and points were prepared for 10 minutes with 5 mW of 532 nm light. It is important to note that the readout and writing powers are the same. Log-log plots of the data in the unsaturated region (<1 watt) revealed that the $\chi^{(2)}\chi^L$ product scales as $jE(\omega)^{1.48}$ and $E(\omega)^{2.15}$ for the GG 495 and OG 550 filters, respectively. SHG values were normalized assuming square law dependence on readout intensity.

Figure 8:
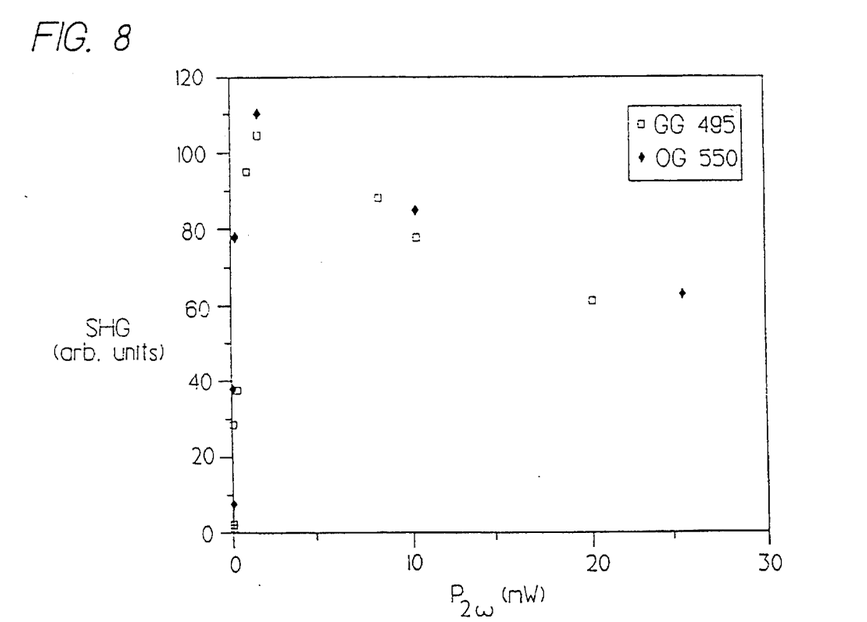
FIG. 8 depicts SHG dependence on 532 nm radiation preparation intensity.

FIG. 8 shows the results of the twenty minute preparation as a function of the average second harmonic seed power with the fundamental average power held constant at one watt. The GG 495 filter was 3 mm thick, and points were prepared for 10 minutes with two W of 1.06 $\mu$m radiation in addition to the indicated power at 532 nm. The OG 550 filter was one mm thick, and points were prepared for 20 minutes with 2 W of 1.06 $\mu$m radiation. The results indicate that there is a sharp rise, a maximum, and a region of decreasing SHG. This is indicative of an erasure mechanism, which is believed to be qualitatively similar to behavior observed in a germanosilicate fiber, as referred to be F. Oullette, K. O. Jill and D. Johnson, Optt. Let. 13, 515 (1988).

Figure 9:
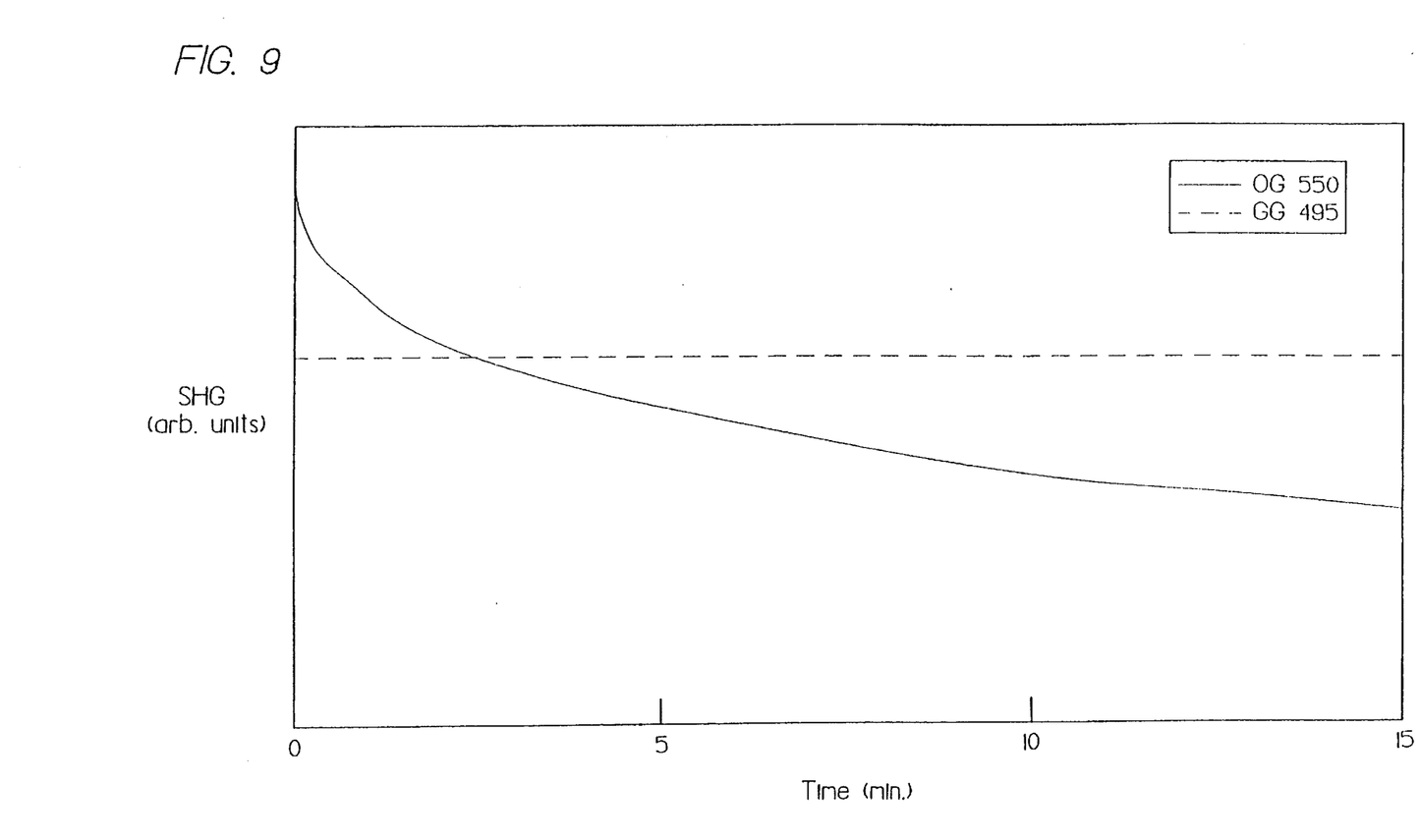
FIG. 9 depicts a SHG erasure effect accomplished with 1.06 μm radiation.

As was noted, the second harmonic dependence in the preparation stage indicates evidence of an erasure mechanism. GG 495 and OG 550 filters, each three mm thick, were prepared for 20 minutes with 2 W and 50 mW of fundamental and second harmonic powers, respectively. Once prepared, it was observed that over a period of several days no apparent decay could be observed when the samples were maintained under ambient conditions (25° C.) in the absence of illumination. However, when the prepared samples were read out with IR radiation only, the signal decayed with time. FIG. 9 shows the decay of both the OG 550 and GG 495 samples. Both filters were three mm thick and were illuminated with two W of 1.06 $\mu$m radiation. The OG 550 exhibits a rapid decay over a period of fifteen minutes, while the OG 495 decayed by only a few percent over the same period. Fitting exponential decays to the data gives a decay rate of $1.5 \times 10^{-2}$ sec$^{-1}$ for the GG 495 filter at two W of average readout power. The OG 550 gives values of $4.1 \times 10^{-2}$ sec$^{-1}$ and $7.7 \times 10^{-2}$ sec$^{-1}$ at two W and three W, respectively. From the decay rates it appears that the erasure effect has a near quadratic dependence on IR power.

Figure 10:
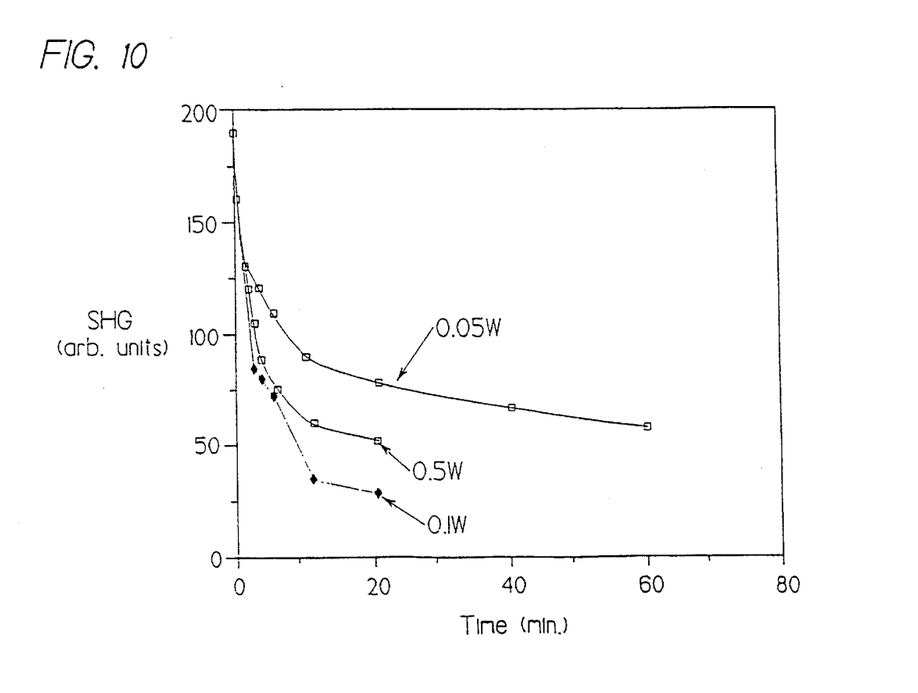
FIG. 10 depicts a SHG erasure effect accomplished with 532 nm radiation.

In addition to the measurements using 1.06 $\mu$m radiation the erasure process was examined using the second harmonic (532 nm). The decay of the second harmonic with time for three different average powers is shown in FIG. 10. The filter was OG 515 having a thickness of three mm. Analysis of the 0.5 watt case shows that the decay cannot be described by a single exponential. The curves exhibit a decay rate which decreases with time and is of the order of $10^{-3}$ sec$^{-1}$ for 0.5 W of average power (0<t<10 min.)

Figure 11:
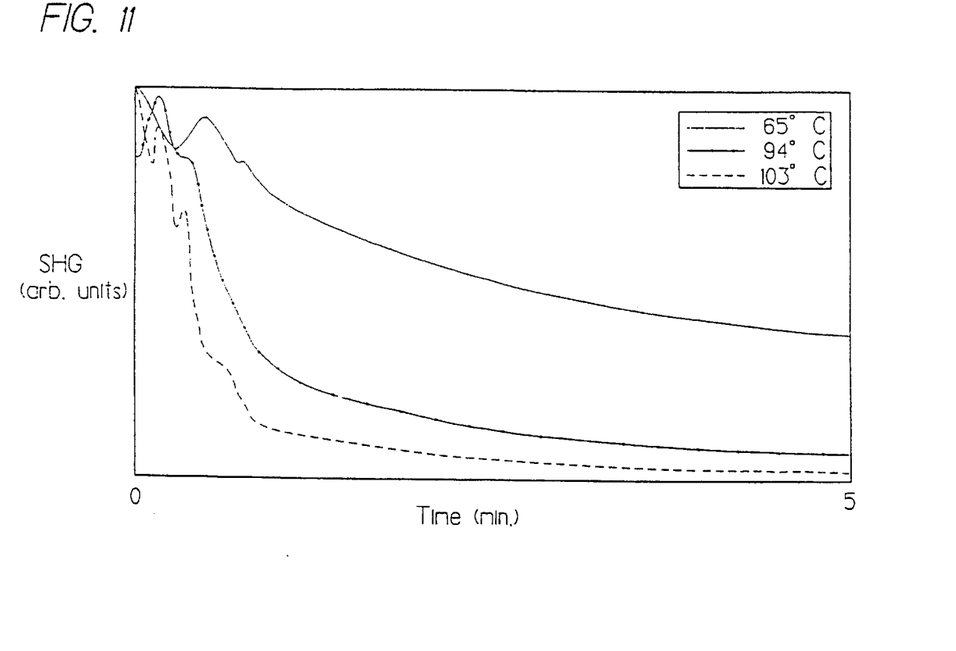
FIG. 11 depicts thermal SHG erasure as a function of time for three different ambient temperatures.

The induced SHG effect was found to be permanent on a time scale of several days under dark conditions at room temperature. This implies that if trap states are responsible for the encoding process, they are deep enough to account for the long lifetime under ambient conditions. In order to determine the activation energy involved, a thermal erasure of the OG 550 filter was examined. FIG. 11 shows the decay of the SHG signal in the OG 550 filter as a function of time for three different temperatures. All samples were 1 mm OG 550 filters, and were read with two W at 1.06 $\mu$m. The decays are well approximated by exponentials and result in an activation energy of 0.6 eV.

The large effect that heating has on the signal decay complicates the interpretation of the optical erasure results, since the locally irradiated region experiences a temperature increase with both IR and green (532 nm) illumination. Measurements were made of the local temperature increase for the two filters. When one W of IR was incident on the one mm filters, the GG 495 temperature 1 mm from the beam center increased by 3.1K, and the OG 550 by 3.0K.

Illumination with 0.1 W of 532 nm light resulted in temperature increases of 0.3 and 0.5K for the GG 495 and OG 550 filters, respectively. Thus, heating plays a roll in optical erasure, but is most likely not the dominant mechanism.

The results discussed thus far strongly favor the encoding of a periodic symmetry breaking phenomenon, most probably an internal electric field. This encoding is believed to find its origin in a nonlinear holographic process, where the spatial phase information is carried by the fundamental and second harmonic waves. Models for similar behavior in germanosilicate fibers suggest that optical rectification fields of the form:

$$\chi^{(3)}(0;\omega,\omega,-2\omega)E^2(\omega)E^*(2\omega)e^{i\Delta kz},$$

where $\Delta k = 2k(\omega) - k(2\omega)$, in the bulk material is responsible for the encoding, as published by R. H. Stolen and H. W. K. Tom, Opt. Lett. 12, 585 (1987). The $\chi^{(3)}$ in silica is very small ($10^{-2}$–$10^{-22}$ m$^2$/V$^2$) and results in approximately one V/cm fields in the fiber. In the prepared SMDG filters of the invention, however, the composite $\chi^{(3)}(0;\omega,\omega,-2\omega)$ is believed to be much larger, especially near the microcrystallite band edge.

In order to place some lower estimate on the internal field, the effect of an applied external field was also investigated. Experiments were performed on OG 550 and GG 495 filters between transverse electrodes. Both samples were prepared with the optical field polarization parallel to the applied electric field, and the GG 495 was also prepared with light polarized perpendicular to the applied field. The application of fields as large as $10^6$ V/m during preparation and readout resulted in no measurable change in SHG conversion efficiency. It is therefore concluded that if the encoding process is viewed in terms of an effective optically generated d.c. field, then this field is large compared to $10^6$ V/m.

The results presented above on the length and readout intensity dependence give evidence that a second order phase matched nonlinear interaction takes place in the prepared samples. The results on the index-summed nonlinear susceptibility tensor properties, determined by varying the readout polarization, are consistent with the presence of a symmetry breaking electric field within the material.

A most likely process for increased interaction length is quasi-phase matching. This mechanism requires a periodic effective nonlinear susceptibility given by:

$$\chi^{(2)} = \chi_0^{(2)} \cos(\Delta kz + \phi), \quad (1)$$

where $\Delta k = 2k(\omega) - k(2\omega)$, and $\phi$ is a constant phase. Combining this phase matching process with the presence of an internal electric field, $E_{dc}(z)$ to break symmetry, leads to $$\chi^{(2)} \sim \chi^{(3)}(-2\omega;\omega,\omega,0)E_{dc}\cos(\Delta kz + \phi), \quad (2)$$

$\chi^{(3)}$ is the third order susceptibility tensor for the composite crystallite glass material, and $E_{dc}$ is the amplitude of the internal field encoded by the writing beams. The polarization experiments require that $E_{dc}$ point along the direction established by the polarization of the writing beams.

Figure 15:
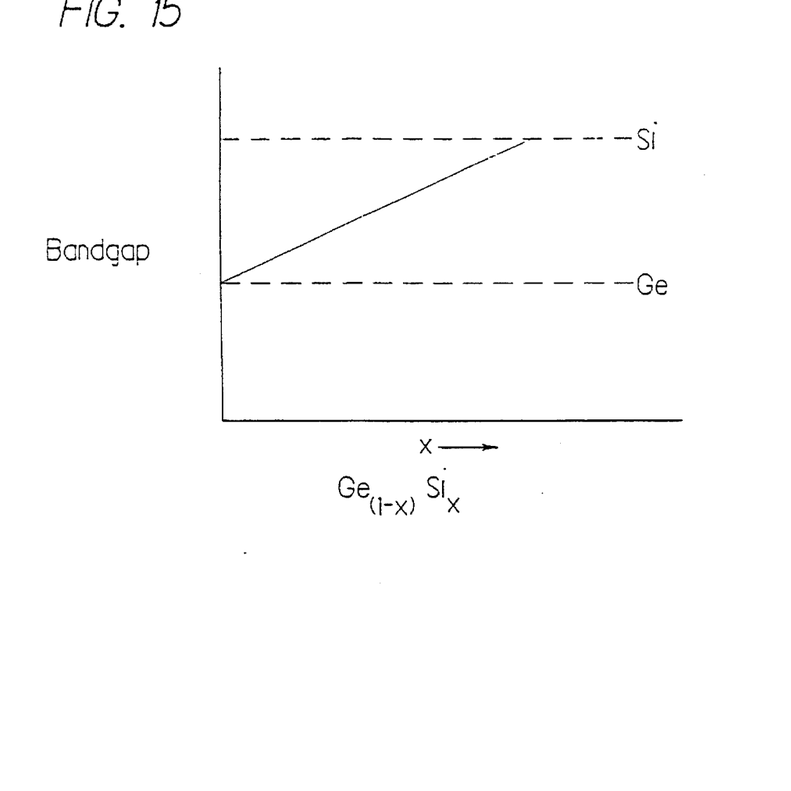
FIG. 15 is a graph illustrating a change in bandgap as a function of composition of a Ge-Si alloy.

The preceding discussion shows that symmetry can be broken and quasi-phase matching can occur if the optical encoding process results in the establishment of a permanent periodic electric field. The results on the response of glasses doped with varying relative concentrations of S and Se, to tune the crystallite bandgap, reveal a preparation resonance of approximately 550 nm. The bandgap can also be excitonically tuned using quantum size effects when the particles are smaller than the exciton radius. This may be controlled by the glass striking conditions. The increase of SHG as the bandgap moves closer into resonance from the long wavelength side indicates that carrier excitation is required. The decrease in SHG after the resonance may be a consequence of absorption in the writing and readout process. By example, FIG. 15 shows the effect on bandgap of a Ge-Si alloy for changes in composition of the Ge and Si components.

The invention has been presented in terms of the results of a variety of measurements on optically encoded second harmonic generation in $CdS_xSe_{1-x}$ doped glasses. The results indicate that effective $\chi^{(2)}$ values as large as $10^{-16}$ m/V are attainable from commercially available filter glasses. This value, along with 5 cm of active length, results in a $10^6$ conversion efficiency, and the generation of a second harmonic signal that is visible in room lights. The effectiveness of one specific type of glass filter over another is believed to be due to Fe impurities which provide more electron trapping sites to lock-in the field.

It should be realized that the use of the invention is not restricted to only the commercially available borosilicate filter glasses described thus far. That is, for a given application the glass host and the particular semiconductor microcrystallite and the concentration thereof may be explicitly defined and fabricated. Also, the use of the invention is not restricted to the bulk, monolithic forms of the glass host material as is typically provided in a filter glass material. That is, the glass host material containing semiconductor microcrystallites may be provided as a coating or layer upon a substrate. By example, a semiconductor doped glass is sputtered into a thin film with doping densities of, for example, 30 percent. Such a film or layer may be integrated with, by example, a conventional laser diode so as to frequency convert the output thereof, after suitable preparation.

Figure 14:
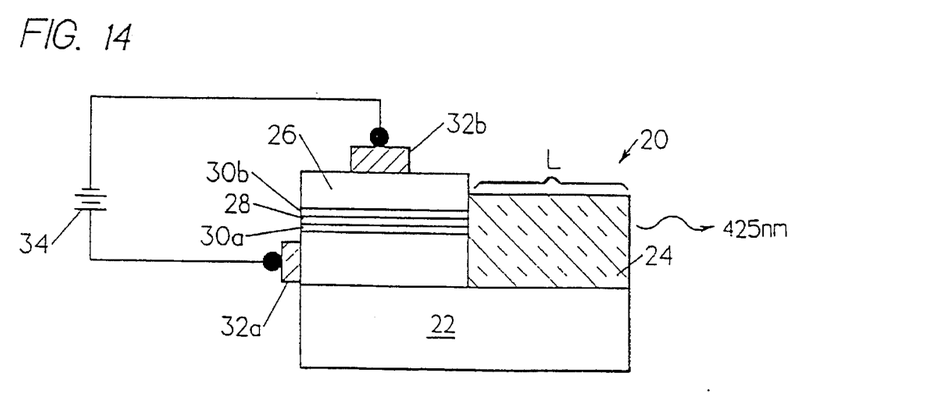
FIG. 14 is a cross sectional view showing an optical device that includes a frequency doubler constructed in accordance with the invention.

By example, and referring to FIG. 14, there is shown an optical device 20 that includes a substrate 22 and a frequency doubler 24. The frequency doubler 24 is comprised of a glass containing semiconductor microcrystallites of the type described above. Device 20 includes, by example, a semiconductor diode laser 26 positioned for radiating the frequency doubler 24. Laser 26 may be of conventional construction having an active region 28 that is bounded by cladding layers 30a and 30b. A pair of electrodes 32a and 32b are provided for coupling the laser diode 26 to a source of power, schematically shown as a battery 34. The semiconductor laser diode 26 has an output wavelength of 850 nm. In accordance with the invention the frequency doubler 24 is prepared as described above so as to generate 425 nm radiation from the input 850 nm. Suitable semiconductor microcrystallite compositions for doubling 850 nm include CdS or CuCl, and related alloys including a third element such as in $CdSe_xS_{1-x}$ semiconductors.

Preferably, the frequency doubler 24 is deposited as a film or coating upon the substrate 22 by sputtering or an equivalent technique. However, the frequency doubler 24 may be bonded to the substrate by an epoxy or any suitable adhesive. In like manner, the substrate 22 may be a substrate that the laser diode 26 is fabricated upon, or the laser diode 26 may be attached to the substrate by an epoxy or any suitable adhesive. The total length L of the frequency doubler 24 need not be any longer than an amount of the bulk glass that is prepared for SHG by the above descried method. For example, L may be equal to approximately 0.5 mm. The frequency doubler 24 may be prepared, after deposition, by irradiating the face of the frequency doubler 24 that is opposite the output face of the laser. The irradiation of the frequency doubler 24 can be accomplished with a system as seen in FIG. 1b modified to include a Ti-Sapphire laser tuned to 850 nm and a frequency doubler for providing the 425 nm radiation. If the frequency doubler 24 is otherwise attached to the substrate 22, the frequency doubler 24 may be prepared as in FIG. 1b, as modified above, and then subsequently bonded to the substrate 22.

The optical device 20 thus includes a SHG wavelength converter of small size and high efficiency for converting the near IR output of the diode 26 to blue green light. One application for such a device is in optical data storage readout systems wherein it is desirable to minimize the optical wavelength so as to increase the bit packing density of the media.

Figure 13A:
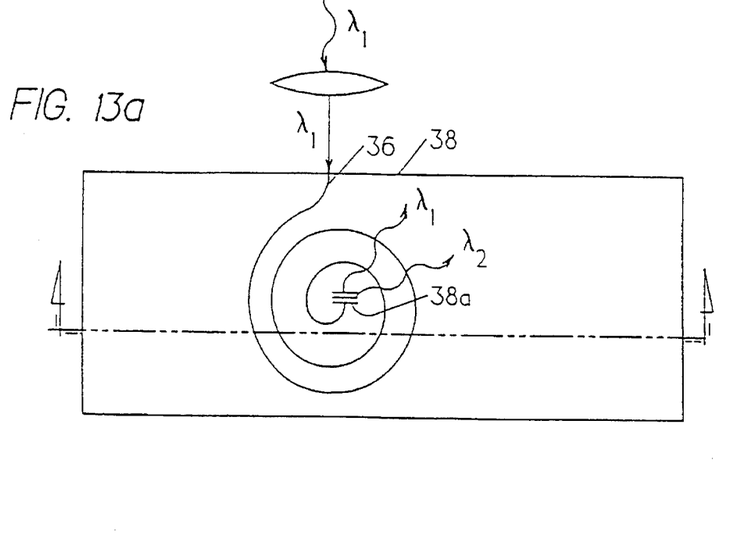
FIG. 13a is a plan view showing a spiral waveguide fabricated within a surface region of a semiconductor microcrystallite doped glass.
Figure 13B:
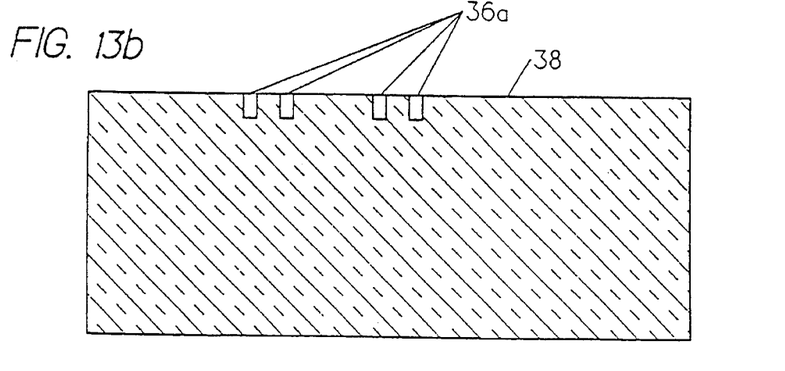

Further in accordance with the invention, and referring to FIGS. 13a and 13b, there is described an optical waveguide that provides SHG.

Specifically, a waveguide 36 is formed in a bulk glass substrate 38. The waveguide is defined by a channel region 36a having an index of refraction that is larger than the index of refraction of the surrounding substrate 38. This results in a guiding and confinement of injected radiation about the waveguide channel. In accordance with the invention a portion of the guided radiation is frequency doubled by the SHG effect resulting from semiconductor microcrystallites embedded within the substrate 38.

Two examples of the fabrication of the waveguide 36 are now presented.

EXAMPLE 1

Low pass filters manufactured by Corning Glass, numbers 3-70 (514 nm) and 3-71 (493 nm), were placed in a $KNO_3$ melt at 400° C. for 20 hours. These filters had $Na_2O$ concentrations of 14.3 percent and 14.4 percent, respectively. Planar waveguides were fabricated through an ion-exchange process to have a depth of 15 μm. Channel waveguides were fabricated by photolithographically masking the glass surface with aluminum during diffusion. The mask provided open diffusion channels having a width of 60 μm. From an effective mode size determined by an output diffraction pattern, in conjunction with measured index of refraction changes, the waveguide depth was determined to be 15 μm.

EXAMPLE 2

A filter glass (Schott 495) was employed, the glass containing a small amount of Na+ and 20 percent K+. Two samples were placed in a 350° C. melt of $RbNO_3$ for 22 hours and 41 hours, respectively. Planar waveguides were made with a depth of 25 μm and 41 μm, respectively. Channel waveguides were fabricated, with an aluminum mask, to have dimensions of 65 μm by 30 μm.

It was found that ion-exchange in these systems resulted in a smaller index of refraction difference in spite of the higher amount of potassium.

This may be explained in terms of a simple model which scales the index change by (a) an amount of ions to be exchanged, and (b) a change in polarizability caused by replacement of ions with larger radii.

This is shown by the equation:

$$\frac{\Delta n_{K-Na}}{\Delta n_{Rb-K}} \approx \frac{N_{Na}[(R_K)^3 - (R_{Na})^3]}{N_K[(R_{Rb})^3 - (R_K)^3]} \approx 2 \quad (3)$$

where, $R_{Na}$=1.57, $R_K$=2.03, $R_{Rb}$=2.16, $N_{Na}$=14.4%, $N_K$=20%.

The waveguides, prepared by the first and second examples described above both provided SHG, after preparation, when a 1.06 μm beam was injected. Preferably, a grating structure 38a is provided at a terminal end of the spiral waveguide to enable extraction of the fundamental $\lambda_1$ and the second harmonic $\lambda_2$.

The use of the SHG effect, in conjunction with an ion-exchange waveguide fabrication technique in the glass host, results in an integration of the optical switching capabilities of these materials with efficient, low cost frequency doubling. As an example, and referring to FIG. 19, there is shown a bichromatic logic switching device 50 that includes two channel waveguides 52 and 54, fabricated as described previously within a surface of a semiconductor microcrystallite doped glass substrate 51. The waveguide 52 is not prepared to generate the second harmonic, while the waveguide 54 is prepared, as described above, to generate the second harmonic. The waveguides approach one another within a region designated by A and are spaced apart at a distance of $\approx \lambda/\sqrt{n_o^2 - n_c^2}$, where λ is the fundamental wavelength propagating in waveguide 52, $n_o$ is the index of refraction of the glass host, and $n_c$ is the index of refraction of the cladding. The spacing between the waveguides is thus generally on the order of the mode confinement length. At high intensity ($I > I_c$) radiation propagating in waveguide 52 couples into the waveguide 54 in a known fashion, where I is the intensity of the radiation propagating in waveguide 52 and $I_c$ is a critical intensity.

Figure 19:
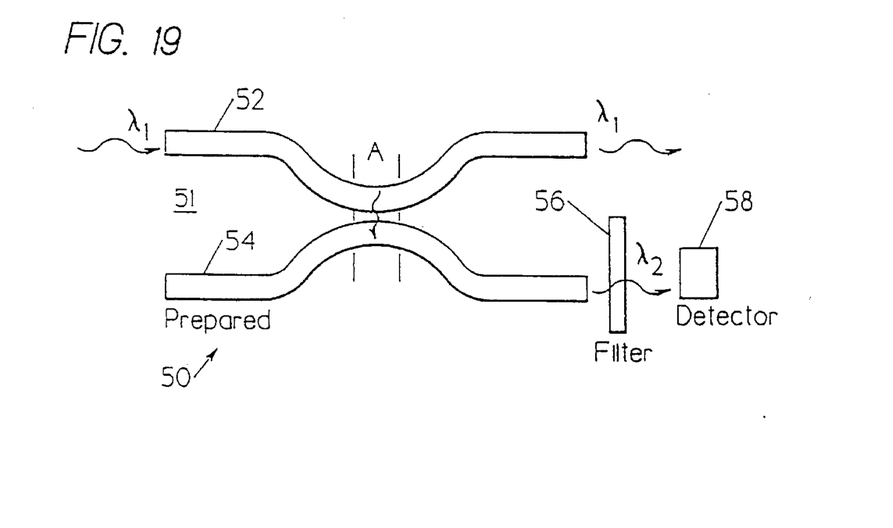
FIG. 19 shows a top view of a bichromatic logic switching device.

In accordance with the invention, when $I > I_c$ a portion of the coupled radiation of the fundamental ($\lambda_1$) is converted to the second harmonic ($\lambda_2$). A filter 56 that is transmissive at $\lambda_2$ is provided at the output of the waveguide 54. A detector 58 is positioned for detecting the presence of the second harmonic. If the detector 58 detects the presence of the second harmonic it is indicated that $I > I_c$. As a result, it is unnecessary to spatially resolve the outputs of the two waveguides 52 and 54 so long as the presence of the second harmonic is detected. The filter 56 may be photolithographically formed at the terminal end of waveguide 54, or may be provided as a separate component.

It is now shown that the provision of SHG in semiconductor microcrystallite doped glasses, as taught by the invention, further enables the use of a laser rod or optical fibers to generate a fundamental wavelength and to also generate a frequency doubled wavelength.

By example, a common and most useful glass laser is Nd:Glass, where Nd is doped at 1–5 wt % into a base glass with, for example, 66 wt % $SiO_2$, 16 wt % $Na_2O$, 5% BaO, 2 wt % $Al_2O_3$ and 1 wt % $Sb_2O_3$. In this regard reference is made to E. Switzer and C. G Young "Glass Lasers" in Lasers Vol. 2, A. K. Levine ed., Marcel Dekker Inc., NY (1968) p. 191.

One recipe of interest herein includes Nd, or any other well known laser-ion such as $Tm^{3+}$, $Er^{3+}$, $Nd^{3+}$, $Yb^{3+}$, or $Ho^{3+}$, in a silica-base glass that includes semiconductor microcrystallites, such as $CdS_xSe_{1-x}$.

Such a laser/doubler may be prepared as follows.

Figure 17:
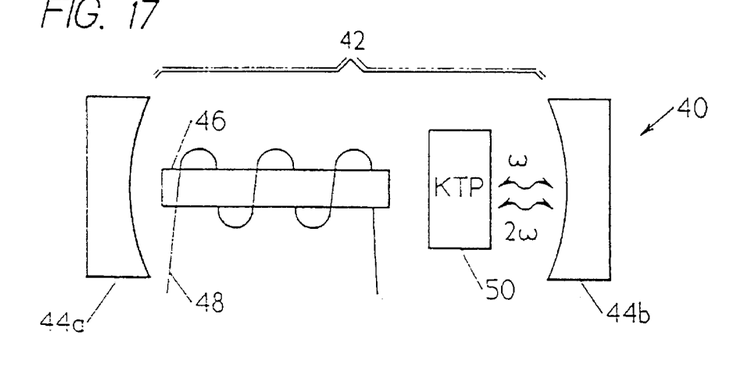
FIG. 17 is a block diagram showing apparatus for preparing a frequency doubling glass laser rod.

Referring to FIG. 17 there is illustrated a laser rod preparation system 40 that includes a laser cavity 42 bounded by reflective mirrors 44a and 44b. A laser rod 46 to be prepared for SHG is installed in the cavity 42 and is optically coupled to a flashlamp 48. An optical frequency doubling component, such as a KTP crystal 50, is provided within the cavity 42. Mirror 44a is 100% reflective at the fundamental wavelength (ω) and mirror 44b is 100% reflective at ω and 2ω. By example, the fundamental wavelength is 1.06 μm and the harmonic is 532 nm.

The laser rod 46 is pumped by the flashlight 48 and operated for a period of time of from several minutes to several hours with the KTP crystal 50. This produces a large ω field and a 2ω field and prepares the laser/doubler for SHG in a manner similar to the injected 1.06 μm and 532 nm used to prepare the sample 20 of FIG. 1b.

Figure 18:
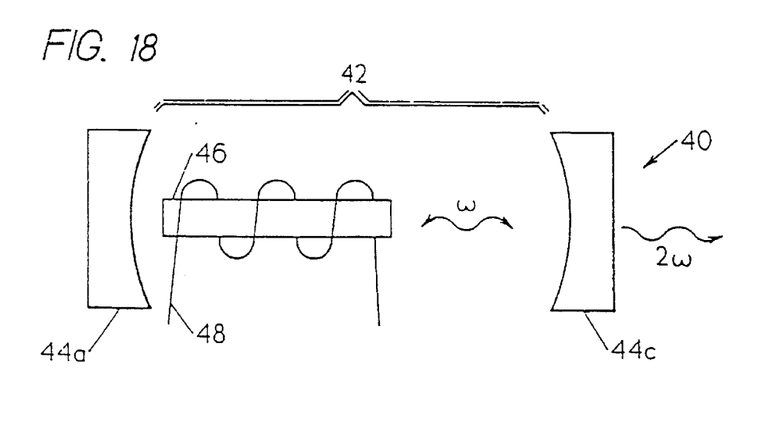
FIG. 18 shows a block diagram of a frequency doubling laser that includes a semiconductor microcrystallite glass rod prepared in accordance with FIG. 17.

Referring to FIG. 18, after the laser rod 46 has been prepared the output mirror 44b is replaced with a mirror 44c that is 100% reflective at ω and substantially transparent at 2ω. The KTP crystal 50 is removed, and the laser is operated to simultaneously produce 1.06 μm and 532 nm. In that the mirror 44c is substantially transparent to the second harmonic the coherent optical output of the laser is at twice the frequency of the laser rod fundamental frequency. In addition, the efficiency is high since the intracavity field at 1.06 μm is very large.

It is within the scope of the invention to remove the prepared rod 46 from the cavity 42 and install same within another laser cavity. It is also within the scope of the invention to provide the mirror 44c such that it is partially transmissive to the fundamental frequency, thereby providing both 1.06 μm and 532 nm at the output.

Figure 16:
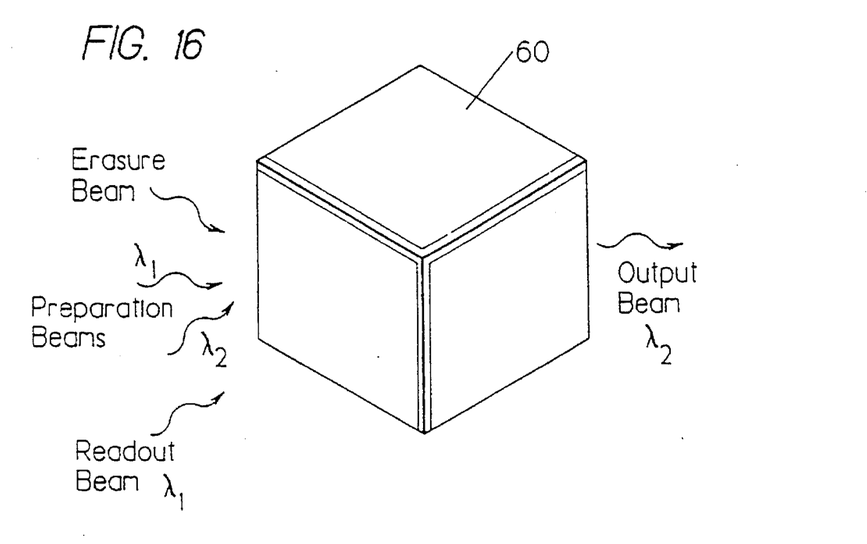
FIG. 16 shows a holographic medium that is constructed and operated in accordance with the invention.

Referring to FIG. 16 there is shown a further embodiment of the invention, specifically, a transmission holographic medium 60. Medium 60 is comprised of a semiconductor microcrystallite doped glass and has typical dimensions of one centimeter on a side. The medium 60 is prepared and recorded with a preparation beam that includes $\lambda_1$ and the second harmonic $\lambda_2$, and is read out with a readout beam having a wavelength of $\lambda_1$. The holographic medium 60 has a plurality of volume holograms stored within that are stored by illuminating a region of the medium with $\lambda_1$, such as 1.06 µm, while $\lambda_2$ is provided to reflect off of an object or pattern to be recorded before entering the medium 60. The medium 60 is exposed to both wavelengths for a period of time sufficient to provide a desired degree of preparation. As a result, simultaneous recording and preparation occurs. Subsequently, when the readout beam is applied to a previously recorded region, an output beam, corresponding to a selected one of the volume holograms, is output at a wavelength of $\lambda_2$. As a result, the holographic medium 60 provides a frequency doubled output. That is, when illuminated with, for example, 1.06 µm radiation, the holographic medium produces a green image.

The erasure mechanism described above can be beneficially employed to erase a selected one or to erase all of the volume holograms stored within the medium 60. As a result, the medium 60 may be written with new information. Optical erasure may be accomplished using another wavelength that is short enough to pump the bandgap of the semiconductor microcrystallites embedded within the medium 60. For example, the erasure beam wavelength may be approximately 4000 Angstroms. The erasure may also be accomplished, depending on the glass host/microcrystallite composition, with $\lambda_1$, $\lambda_2$, and/or thermally. By what ever erasure mechanism is employed, a random access read/write optical memory is provided. By directing the erasure beam to a selected region, only the information stored within that region is erased. The medium 60 may also be partially or totally erased by blanket illuminating a selected portion or the entire volume of the medium 60.

In conclusion, it has been shown that centrosymmetric glasses doped with $CdS_xSe_{1-x}$ microcrystallites may be optically prepared to produce a phase matched second harmonic generation process. This invention extendable to the quantum dot regime, where quantum confinement results in larger nonlinearities, and to other semiconductors, than those specifically mentioned above. Other wavelengths may also be employed to prepare and readout the material. The bulk glass may be provided as a monolithic body, as a film, or as a coating applied to a substrate. Sputtering is one suitable process for fabricating the coating. In this regard the material may be integrated with a laser diode device to provide a fundamental and a second harmonic output.

While the invention has been particularly shown and described with respect to a preferred embodiment thereof, it will be understood by those skilled in the art that changes in form and details may be made therein without departing from the scope and spirit of the invention.

What is claimed is:

1. An optical switching device comprising a glass substrate having semiconductor microcrystallites embedded within, said glass substrate including a first waveguide and a second waveguide formed within a surface thereof and spaced apart along at least a portion of a length thereof such that radiation having a wavelength of $\lambda_1$ propagating in said first waveguide couples into said second waveguide when the intensity of the radiation is greater than a critical intensity, said second waveguide receiving the coupled radiation and converting same to a wavelength $\lambda_2$, wherein $\lambda_2$ is one half of $\lambda_1$.

2. An optical switching device as set forth in claim 1 and further including means for detecting the presence of radiation having a wavelength of $\lambda_2$, said detecting means being optically coupled to said second waveguide.

3. An optical switching device as set forth in claim 2 wherein said detecting means includes a filter for passing radiation having a wavelength of $\lambda_2$.

4. A bichromatic switching device, comprising:

a substrate;

a first waveguide formed within said substrate;

a second waveguide formed within said substrate;

said first waveguide and said second waveguide having an approach region wherein said first and second waveguides are spaced apart from one another by a distance that is on the order of a mode confinement length, the mode confinement length being a function of at least a wavelength of electromagnetic radiation that propagates within said first waveguide; wherein a portion of the electromagnetic radiation that propagates within said first waveguide couples into said second waveguide within said approach region; and wherein said second waveguide includes means for converting a portion of said coupled electromagnetic radiation to electromagnetic radiation having a wavelength that is one half of the wavelength of the electromagnetic radiation that propagates within said first waveguide.

5. A bichromatic switching device as set forth in claim 4 wherein said substrate is comprised of a glass, and wherein said converting means is comprised of semiconductor microcrystallites that are disposed within the glass.

6. A bichromatic switching device as set forth in claim 4 and further comprising a wavelength selective means that is optically coupled to said second waveguide for outputting the electromagnetic radiation having a wavelength that is one half of the wavelength of the electromagnetic radiation that propagates within said first waveguide.

7. A bichromatic switching device as set forth in claim 6 and further comprising detector means having an input coupled to said wavelength selective means for detecting a presence of the electromagnetic radiation having a wavelength that is one half of the wavelength of the electromagnetic radiation that propagates within said first waveguide.

* * * * *